(12) United States Patent
Ahn et al.

(10) Patent No.: US 8,891,323 B2
(45) Date of Patent: Nov. 18, 2014

(54) SEMICONDUCTOR MEMORY DEVICE CAPABLE OF MEASURING WRITE CURRENT AND METHOD FOR MEASURING WRITE CURRENT

(71) Applicant: SK Hynix Inc., Icheon-si (KR)

(72) Inventors: Chang Yong Ahn, Icheon-si (KR); Ho Seok Em, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 26 days.

(21) Appl. No.: 13/720,974

(22) Filed: Dec. 19, 2012

(65) Prior Publication Data

US 2014/0063905 A1    Mar. 6, 2014

(30) Foreign Application Priority Data

Aug. 29, 2012 (KR) .......................... 10-2012-0094865

(51) Int. Cl.
| | |
|---|---|
| *G11C 7/00* | (2006.01) |
| *G11C 29/50* | (2006.01) |
| *G11C 11/21* | (2006.01) |
| *G11C 11/22* | (2006.01) |
| *G11C 13/00* | (2006.01) |
| *G11C 16/00* | (2006.01) |

(52) U.S. Cl.
CPC ................ *G11C 29/50* (2013.01); *G11C 11/21* (2013.01); *G11C 29/50008* (2013.01); *G11C 11/22* (2013.01); *G11C 13/00* (2013.01); *G11C 16/00* (2013.01); *G11C 2029/5006* (2013.01)
USPC ........................ 365/201; 365/189.16; 365/220

(58) Field of Classification Search
CPC . G11C 13/0064; G11C 13/0069; G11C 29/00
USPC ................... 365/145, 148, 158, 163, 189.07, 365/189.16, 201, 220, 189.04
See application file for complete search history.

(56) References Cited

U.S. PATENT DOCUMENTS

| | | | | |
|---|---|---|---|---|
| 2004/0196693 | A1* | 10/2004 | Iwata ............................ | 365/158 |
| 2006/0126381 | A1* | 6/2006 | Khouri et al. ................. | 365/163 |
| 2006/0181932 | A1* | 8/2006 | Cho et al. ..................... | 365/185.23 |
| 2008/0062753 | A1* | 3/2008 | Cho et al. ..................... | 365/163 |
| 2008/0068903 | A1* | 3/2008 | Park et al. ................. | 365/189.16 |
| 2008/0074918 | A1* | 3/2008 | Ro et al. ......................... | 365/163 |
| 2008/0123389 | A1* | 5/2008 | Cho et al. ..................... | 365/148 |
| 2009/0043973 | A1* | 2/2009 | Kang et al. ................... | 711/154 |
| 2010/0103726 | A1* | 4/2010 | Bae et al. ..................... | 365/163 |
| 2010/0165725 | A1* | 7/2010 | Bedeschi ...................... | 365/163 |
| 2010/0259974 | A1* | 10/2010 | Shin et al. .................... | 365/163 |
| 2011/0261615 | A1* | 10/2011 | Choi et al. .................... | 365/163 |
| 2013/0163320 | A1* | 6/2013 | Lam et al. .................... | 365/163 |

FOREIGN PATENT DOCUMENTS

| | | |
|---|---|---|
| KR | 1020020012165 A | 2/2002 |
| KR | 1020110077570 A | 7/2011 |

* cited by examiner

*Primary Examiner* — Gene Auduong
(74) *Attorney, Agent, or Firm* — William Park & Associates Patent Ltd.

(57) ABSTRACT

A method for measuring a write current of a semiconductor memory device includes the steps of: programming initial data into memory cells which are to be programmed substantially at the same time; determining whether the memory cells are programmed into the same state or not; inputting test data when the memory cells are programmed into the same state; setting write current paths of the memory cells by comparing the initial data and the test data; and measuring a write current consumed when the test data are programmed into the memory cells.

15 Claims, 6 Drawing Sheets

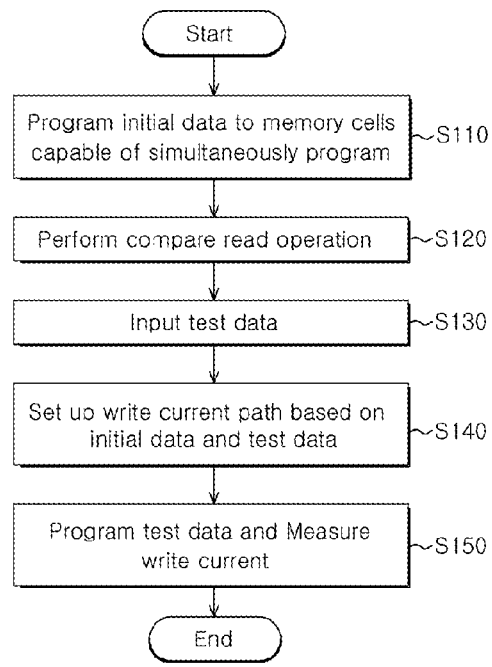

SEMICONDUCTOR MEMORY DEVICE CAPABLE OF MEASURING WRITE CURRENT AND METHOD FOR MEASURING WRITE CURRENT

CROSS-REFERENCES TO RELATED APPLICATION

The present application claims priority under 35 U.S.C. §119(a) to Korean application number 10-2012-0094865, filed on Aug. 29, 2012, in the Korean Intellectual Property Office, which is incorporated herein by reference in its entirety.

BACKGROUND

1. Technical Field

The present invention generally relates to a semiconductor memory device, and more particularly, to a semiconductor memory device capable of measuring a write current and a method for measuring a write current.

2. Related Art

In general, a semiconductor memory device is classified into a volatile memory device and a nonvolatile memory device. The volatile memory device loses data stored therein when power supply is cut off, but the nonvolatile memory device maintains data stored therein even though power supply is cut off. The nonvolatile memory device may include various types of memory cells.

The nonvolatile memory device may be divided into a flash memory device, a ferroelectric RAM (FRAM) using a ferroelectric capacitor, a magnetic RAM (MRAM) using a tunneling magneto-resistive (TMR) layer, a phase change memory device using chalcogenide alloys and the like, depending on the structure of memory cells. In particular, the phase change memory device is a nonvolatile memory device using phase change based on temperature change, that is, resistance change. For this reason, the phase change memory device is also referred to as a variable resistance memory device.

The phase change memory device includes memory cells formed of a phase change material, for example, a chalcogenide alloy which is a germanium(Ge)-antimony(Sb)-tellurium(Te) compound (GST) (hereafter, referred to as a GST material). The GST material has an amorphous state having a relatively high resistivity and a crystalline state having a relatively low resistivity. The GST material may be heated to program data corresponding to the amorphous state or the crystalline state into the memory cell of the phase change memory device. The amorphous state or the crystalline state of the GST material may be controlled by adjusting the magnitude of a current for heating the GST material and the application time of the current, for example.

As described above, the state of the memory cell of the phase change memory device is changed by an applied write current. Furthermore, the state of the memory cell of the phase change memory device is determined according to how much current the memory cell can pass. When the write current is varied by an effect of a write driver, a peripheral circuit, or another memory cell programmed at the same time during a write operation of the phase change memory device, an unexpected resistance distribution of the memory cell may be formed. For this reason, a test for the memory cell cannot be accurately performed.

Therefore, there is a demand for a method capable of measuring a write current applied to a memory while excluding an effect of a peripheral circuit or another memory cell programmed at the same time in a test operation of the phase change memory device.

SUMMARY

A semiconductor memory device capable of measuring a write current and a method for measuring a write current are described herein.

In embodiment, a method for measuring a write current of a semiconductor memory device includes the steps of: programming initial data into memory cells which are to be programmed at substantially the same time; determining whether the memory cells are programmed into the same state or not; inputting test data when the memory cells are programmed into the same state; setting write current paths of the memory cells by comparing the initial data and the test data; and measuring a write current consumed when the test data are programmed into the memory cells.

In an embodiment, a semiconductor memory device includes: a plurality of memory cells configured to be programmed at substantially the same time; a plurality of write drivers allocated to the respective memory cells and configured to provide a write current set according to the state of input data to the respective memory cells; and a plurality of write current path control units allocated to the respective memory cells and configured to compare initial data programmed into the respective memory cells to test data to be programmed into the respective memory cells and set a write current path between the memory cells and the corresponding write drivers according to the comparison result, during a test operation.

BRIEF DESCRIPTION OF THE DRAWINGS

Features, aspects, and embodiments are described in conjunction with the attached drawings, in which:

FIG. 2 is a flow chart showing a method for measuring a write current during a test operation;

FIG. 3 is a diagram illustrating a data pattern used for measuring a write current;

DETAILED DESCRIPTION

Hereinafter, a semiconductor memory device capable of measuring a write current and a method for measuring a write current according to various embodiments will be described below with reference to the accompanying drawings through the embodiments.

Various embodiments will be described below in more detail with reference to the accompanying drawings. The embodiments may, however, be embodied in different forms and should not be construed as limited to the embodiments set forth herein. Rather, these embodiments are provided so that this disclosure will be thorough and complete, and will fully convey the scope of the embodiments to those skilled in the art.

The drawings are not necessarily to scale and in some instances, proportions may have been exaggerated in order to clearly illustrate features of the embodiments. In this specification, specific terms have been used. The terms are used to describe the embodiments, and are not used to qualify the sense or limit the scope of the embodiments.

In this specification, 'and/or' represents that one or more of components arranged before and after 'and/or' is included. Furthermore, 'connected/coupled' represents that one component is directly coupled to another component or indirectly coupled through another component. In this specification, a singular form may include a plural form as long as it is not specifically mentioned in a sentence. Furthermore, 'include/comprise' or 'including/comprising' used in the specification represents that one or more components, steps, operations, and elements exists or are added.

Figure 1:
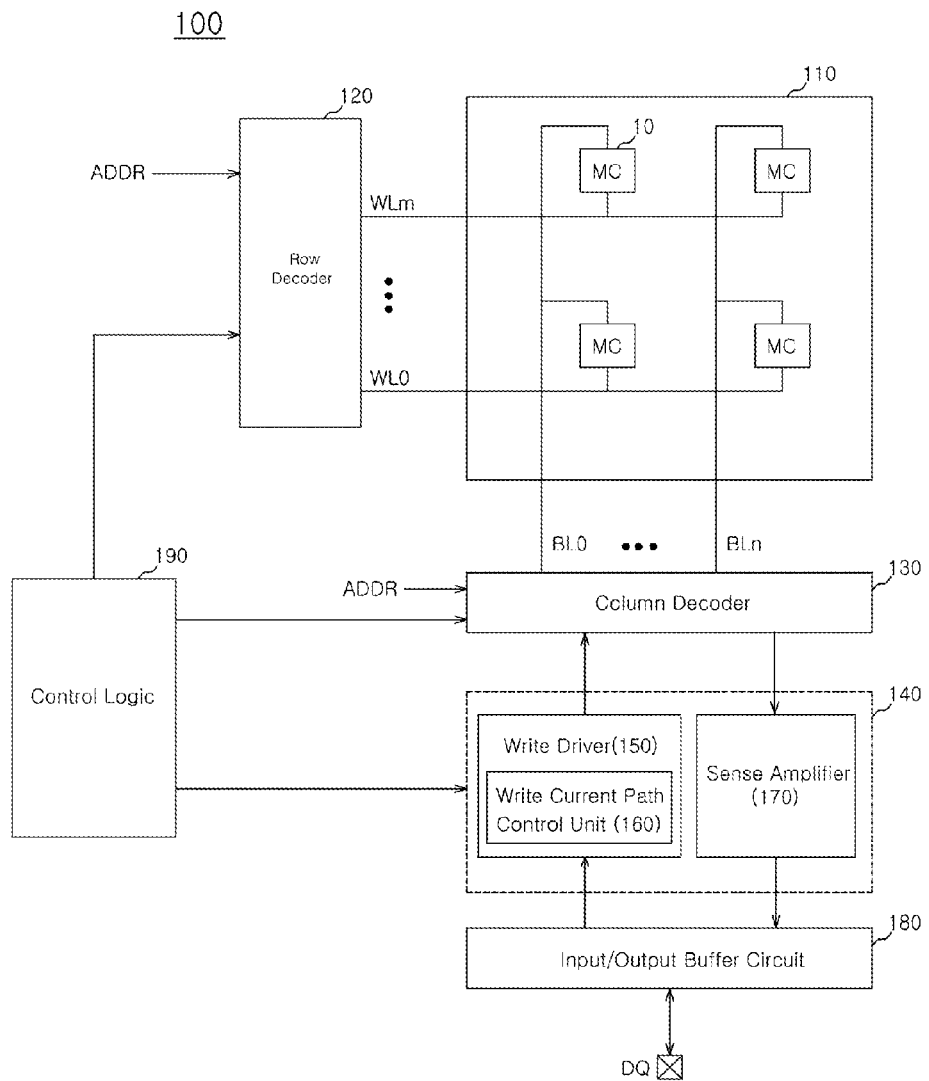
FIG. 1 is a block diagram illustrating a semiconductor memory device according to an embodiment.

FIG. 1 is a block diagram illustrating a semiconductor memory device according to an embodiment. Hereafter, a case in which the semiconductor memory device 100 is a phase change memory device using resistance change based on temperature change, that is, phase change will be taken as example for description.

Referring to FIG. 1, the nonvolatile memory device 100 may include a memory cell array 110, a row decoder 120, a column decoder 130, a data read/write circuit 140, an input/output buffer circuit 180, and a control logic 190.

The memory cell array 110 may include a plurality of memory cells MCs (i.e., 10) arranged at the respective intersections between bit lines BL0 to BLn and word lines WL0 to WLm. Although not illustrated, the memory cells MCs may be included in a group such as a block, mat, or partition. The memory cells MCs may be grouped according to the arrangement positions of the memory cells MCs and the connection structure between the memory cells MCs and input/output pins.

The row decoder 120 may operate according to the control of the control logic 190. The row decoder 120 may be connected to the memory cell array 110 through a plurality of word lines WL. The row decoder 120 may be configured to decode an address ADDR inputted from outside. The row decoder 120 may provide a select voltage to a selected word line, and provide an unselect voltage to an unselected word line according to the decoding result.

The column decoder 130 may operate according to the control of the control logic 190. The column decoder 130 may be connected to the memory cell array 110 through a plurality of bit lines BL. The column decoder 130 may be configured to decode the address ADDR. The column decoder 130 may be configured to electrically connect the bit lines BL to the data read/write circuit 140 according to the decoding result.

The data read/write circuit 140 may be operated according to the control of the control logic 190. The data read/write circuit 140 may include a write driver 150 and a sense amplifier 170.

The write driver 150 may be configured to provide a write current to a bit line BL in response to a write driver control signal (for example, a write driver enable signal). For example, the write driver 150 may provide a write current for writing (or programming) data '1' or '0' into a selected memory cell MC (i.e., 10).

The write driver 150 may include a write current path control unit 160. FIG. 1 illustrates that the write current path control unit 160 is included in the write driver 150, but the write current path control unit 160 may be provided outside the write driver 150.

The write current path control unit 160 may be configured to control a write current applied from the write driver 150 to be applied or not to be applied to a memory cell MC. That is, the write current path control unit 160 may control a write current path to be formed or not to be formed. The operation of the write current path control unit 160 may be performed while the semiconductor memory device 100 operates in a test mode. For example, when a write current is applied only to a memory cell MC selected by the write current path control unit 160, it is possible to measure the write current applied to the selected memory cell MC while excluding an effect of a peripheral circuit or another memory cell MC programmed at the same time. The configuration and operation of the write current path control unit 160 will be described in detail below.

The sense amplifier 170 may be configured to read data stored in the selected memory cell MC in response to a sense amplifier control signal (for example, a sense amplifier enable signal) during a read operation. The sense amplifier 170 may sense a difference between a reference voltage and a cell current (or voltage) flowing from the selected memory cell MC. Furthermore, the sense amplifier 145 may determine the data stored in the memory cell MC from the sensing result.

The input/output buffer circuit 180 may be configured to receive data from an external device (for example, a memory controller, a memory interface, a host device, a test device or the like) or output data to the external device through a data pad DQ. For this operation, the input/output output buffer circuit 180 may include a data latch circuit (not illustrated) and an output driving circuit (not illustrated).

The control logic 190 may be configured to control overall operations of the semiconductor memory device 100 in response to a command provided from the external device. For example, the control logic 190 may control read, program (or write), and erase operations of the semiconductor memory device 100. Furthermore, when the semiconductor memory device 100 is configured as a phase change memory device, the erase operation may indicate an operation of programming all selected memory cells to have an amorphous state or crystalline state.

The control logic 190 may be configured to control a series of operations for measuring a write current, for example, an initial data write operation, a compare write operation, a write current path setting operation, and a test data write operation, while the semiconductor memory device 100 may operate in a test mode. The respective operations are performed by the corresponding function blocks (for example, the write driver 150, the write current path control unit 160, the sense amplifier 170 and the like) according to the control of the control logic 190. The series of operations for measuring a write current will be described in detail with reference to a flow chart of FIG. 2.

FIG. 2 is a flow chart showing a method for measuring a write current during a test operation. FIG. 3 is a diagram illustrating a data pattern used for measuring a write current. A write current applied to a specific memory cell of the semiconductor memory device 100 of FIG. 1 may be measured depending on necessities. For example, when a test operation for checking the characteristic of a specific memory cell is performed, a write current applied to the memory cell may be measured. The method for measuring a write current will be described with reference to FIGS. 2 and 3.

At step S110, initial data are programmed into memory cells. Here, the programmed memory cells indicate memory cells which can be accessed at substantially the same time, that is, programmed at substantially the same time, due to the physical characteristics of the semiconductor memory device 100 of FIG. 1. In FIG. 3, suppose that memory cells MC0 to MC7 connected to eight data I/O pins I/O0 to I/O7, respectively, can be programmed at substantially the same time, for convenience of description.

The initial data programmed into the respective memory cells MC0 to MC7 may have the same data value. For example, as illustrated in FIG. 3, the initial data may include a data pattern having only data '1'. As another example, the initial data may include a data pattern having only data '0'. When the semiconductor memory device 100 is configured as a phase change memory device, the initial data may include a data pattern having only data corresponding to a crystalline state or data corresponding to an amorphous state.

At step S120, a compare read operation may be performed on the memory cells MC0 to MC7 in which the initial data are programmed. The compare read operation may be defined as a read operation of determining whether the memory cells having the initial data programmed therein store the same data or not. In other words, the compare read operation may be a read operation of determining whether memory cells are programmed into the same state or not. When the memory cells having the initial data programmed therein do not store the same data, step S110 may be performed again. As another example, when the memory cells having the initial data programmed therein do not store the same data, the test operation may be determined to be an error state and then stopped.

At step S130, test data may be inputted to the semiconductor device 100. The test data may include a data pattern in which only data to be programmed in a memory cell whose write current is to be measured is set to the opposite value to the initial data. For example, as illustrated in FIG. 3, the test data may include a data pattern in which only data (data '0') to be programmed into the memory cell MC0 whose write current is to be measured is set to the opposite value to the initial data (data '1'). When the initial data includes a data pattern having only data '0', the test data may include a data pattern in which only data to be programmed into the memory cell MC0 whose write current is to be measured is set to data '1'.

At step S140, a write current path may be set up based on the initial data and the test data. That is, the write current path may be formed to apply a write current to a memory cell of which the initial data and the test data have the opposite values. Furthermore, a write current path is not formed so as not to apply a write current to a memory cell of which the initial data and the test data are equal to each other. This means that the physical path may be controlled to pass a write current only to the memory cell whose write current is to be measured by the initial data and the test data.

At step S150, the test data may be programmed into the memory cell MC0 to MC7, and a write current applied at this time is measured. Through step S140, only the write current path of the memory cell MC0 whose write current is to be measured may be formed. Therefore, program operations for the other memory cells MC1 to MC7 excluding the memory cell MC0 are not performed.

According to the method for measuring a write method, only a memory cell whose write current is to be measured may be selected to measure the write current through the initial data write operation, the compare read operation, the write current path setting operation, and the test data write operation.

Figure 4:
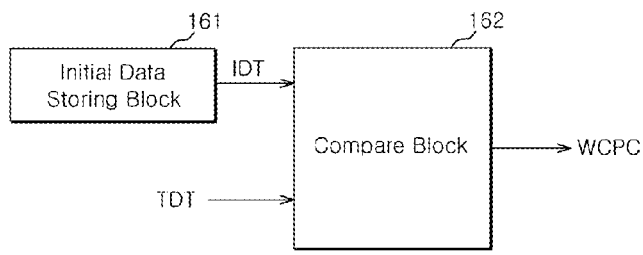
FIG. 4 is a block diagram illustrating a write current path control unit according to an embodiment.

FIG. 4 is a block diagram illustrating the write current path control unit according to an embodiment. Referring to FIG. 4, the write current path control unit 160 may include an initial data storing block 161 and a compare block 162.

The initial data storing block 161 may be configured to store initial data. The initial data storing block 161 may provide the stored initial data to the compare block 162.

The compare block 162 may be configured to compare the initial data and test data. The compare block 162 may be configured to activate or deactivate a write current path control signal WCPC according to the comparison result between the initial data IDT and the test data TDT. For example, when the initial data and the test data are different from each other, the compare block 162 activates the write current path control signal WCPC. According to the activated write current control signal WCPC, a write current path of the corresponding memory cell is formed. As another example, when the initial data and the test data are equal to each other, the compare block 162 deactivates the write current path control signal WCPC. According to the deactivated write current path control signal WCPC, a write current path of the corresponding memory cell is not formed.

Figure 5:
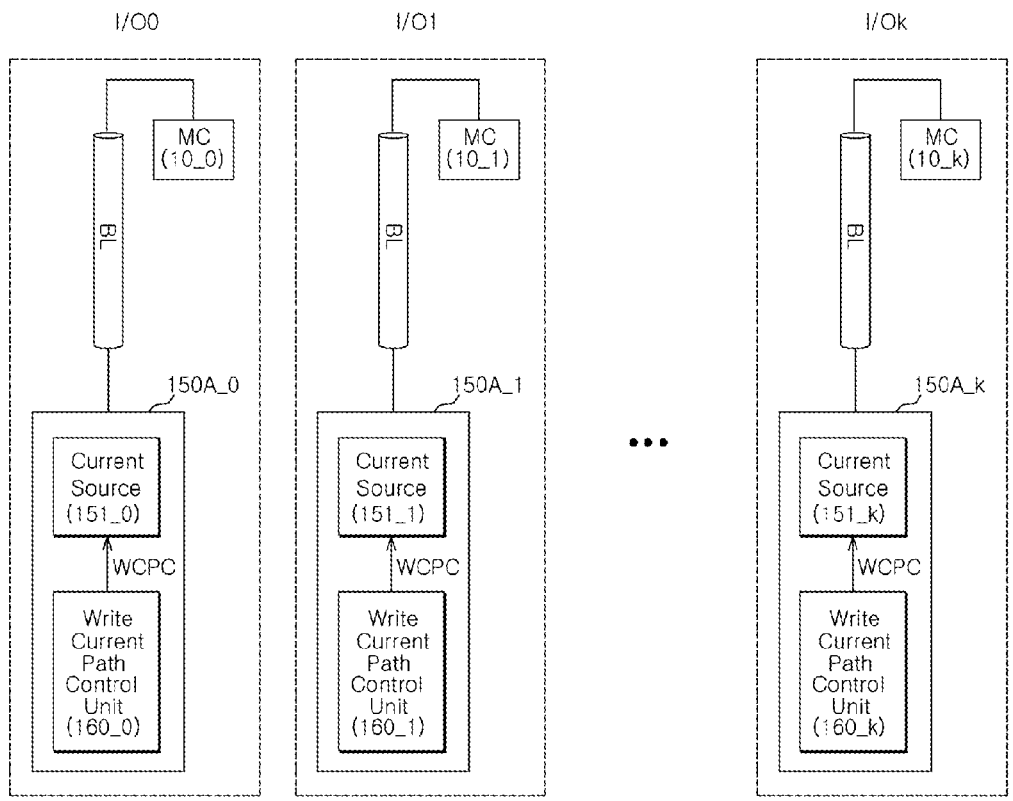
FIG. 5 is a circuit diagram for explaining a method for measuring a write current according to an embodiment.

FIG. 5 is a circuit diagram for explaining the method for measuring a write current according to an embodiment. The method for measuring a write current according to an embodiment will be described through the write current path control unit 160 included in the write driver 150A (i.e., 150A_0 to 150A_k). Furthermore, suppose that memory cells 10_0 to 10__k connected to the respective data I/O pins I/O0 to I/Ok can be programmed at substantially the same time, as illustrated in FIG. 3.

The memory cells 10_0 to 10__k which can be programmed at substantially the same time are programmed by the corresponding write drivers 150A_0 to 150A_k. For example, the memory cell 10_0 may be programmed by the corresponding write driver 150A_0, the memory cell 10_1 may be programmed by the corresponding write driver 150A_1, and the memory cell 10__k may be programmed by the corresponding write driver 150A_k.

The write drivers 150A_0 to 150A_k may include write current path control units 160_0 to 160__k, respectively. The write current path control units 160_0 to 160__k may or may not form a current path between the memory cells 10_0 to 10__k and the write drivers 150A_0 to 150A_k, respectively, through the write current path control signal WCPC. For example, the write current path control units 160_0 to 160__k may control (that is, activate or deactivate) current sources 151_0 to 151__k of the write drivers 150A_0 to 150A_k according to the write current path control signal WCPC. Accordingly, a write current path may or may not be formed between the memory cells 10_0 to 10__k and the write drivers 150A_0 to 150A_k.

For convenience of description, the memory cell 10_0, the write driver 150A_0, and the write current path control unit 160_0 will be taken as an example for description. As described with reference to FIG. 4, when the write current path control unit 160_0 provides the activated write current path control signal WCPC to the current source 151_0 based on the initial data and the test data, the current source 151_0 is enabled. Accordingly, a write current path may be formed between the memory cell 10_0 and the write driver 150A_0. On the other hand, when the write current path control unit 160_0 provides the deactivated write current path control signal WCPC to the current source 151_0 based on the initial data and the test data, the current source 151_0 is deactivated. Accordingly, a write current path may not be formed between the memory cell 10_0 and the write driver 150A_0. FIG. 5 also illustrates bit lines BL between the memory cells MC and the write drivers 150A.

Figure 6:
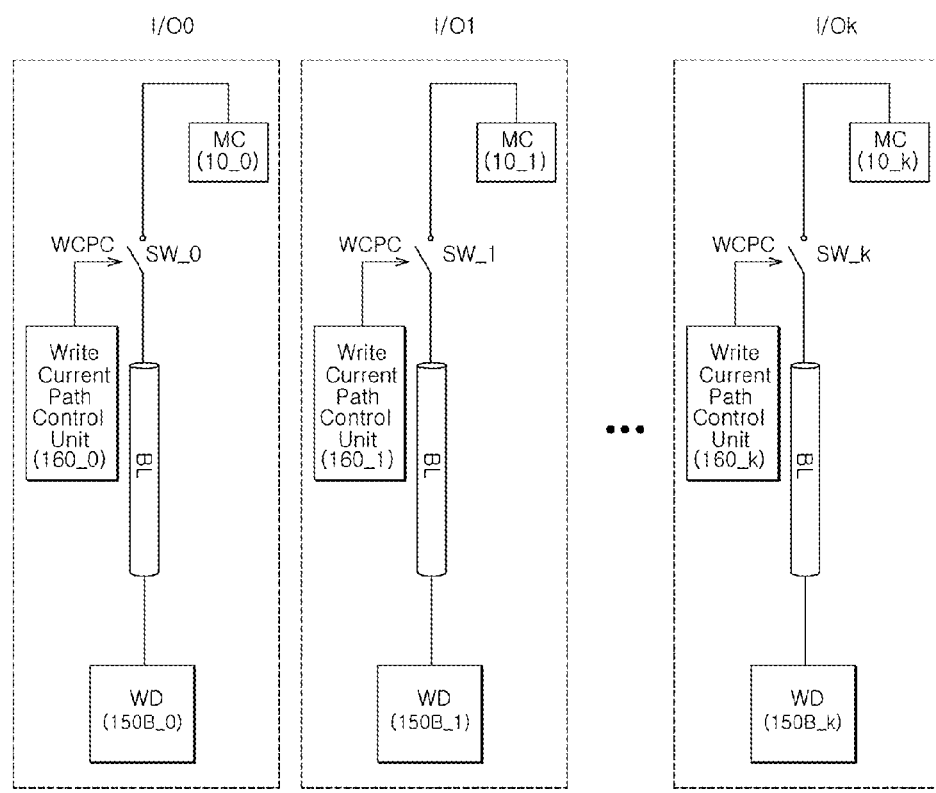
FIG. 6 is a circuit diagram for explaining a method for measuring a write current according to an embodiment.

FIG. 6 is a circuit diagram for explaining a method for measuring a write current according to an embodiment. The method for measuring a write current according to an embodiment will be described through a write current path control unit 160 provided outside a write driver 150A. Furthermore, suppose that the memory cells 10_0 to 10_k connected to the data I/O pins 10_0 to 10_k can be programmed at substantially the same time, as illustrated in FIG. 3.

The memory cells 10_0 to 10_k which can be programmed at substantially the same time are programmed by corresponding write drivers 150B_0 to 150B_k. For example, the memory cell 10_0 may be programmed by the corresponding write driver 150B_0, the memory cell 10_1 may be programmed by the corresponding write driver 150B_1, and the memory cell 10_k may be programmed by the corresponding write driver 150B_k.

Between the memory cells 10_0 to 10_k and the write drivers 150B_0 to 150B_k, switches SW_0 to SW_k may be respectively connected. The switches SW_0 to SW_k may or may not form a current path between the memory cells 10_0 to 10_k and the write drivers 150B_0 to 150B_k according to the control of the corresponding write current path control units 160_0 to 160_k. For example, the switches SW_0 to SW_k may be turned on or shorted according to the activated write current path control signal WCPC. Accordingly, a current path may be formed between the memory cells 10_0 to 10_k and the write drivers 150B_0 to 150B_k.

For convenience of description, the memory cell 10_0, the write driver 150B_0, the write current path control unit 160_0, and the switch SW_0 will be taken as an example for description. As described with reference to FIG. 4, when the write current path control unit 160_0 provides the activated write current path control signal WCPC to the switch SW_0 based on the initial data and the test data, the switch SW_0 is turned on or shorted. Accordingly, a write current path is formed between the memory cell 10_0 and the write driver 150B_0. Through such a current path, the write driver 150B_0 may provide a write current to the memory cell 10_0. On the other hand, when the write current path control unit 160_0 provides the deactivated write current path control signal WCPC to the switch SW_0 based on the initial data and the test data, the switch SW_0 is turned off or opened. Accordingly, a write current path is not formed between the memory cell 10_0 and the write driver 150B_0. Therefore, although the write driver 150B_0 provides a write current to the memory cell 10_0, the memory cell 10_0 is not programmed because a write current path was not formed.

According to the embodiments, it is possible to measure the write current applied to the selected memory cell while excluding an effect of a peripheral circuit or another memory cell programmed at substantially the same time during a test operation of the semiconductor memory device 100 of FIG. 1. FIG. 6 also illustrates bit lines BL between the switches SW and the write drivers WD.

Figure 7:
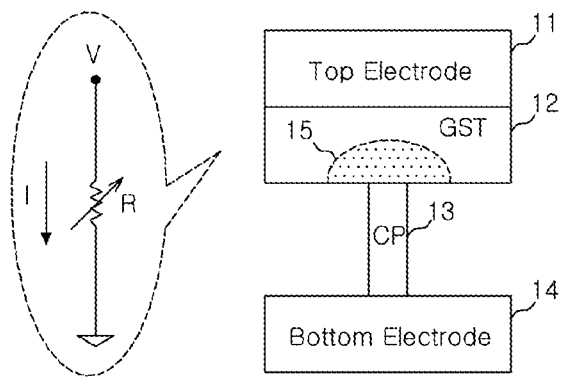
FIG. 7 is a diagram for explaining a memory element of a memory cell of FIG. 1.

FIG. 7 is a diagram for explaining a memory element of a memory cell of FIG. 1. The memory cell of the semiconductor memory device 100 may include a memory element and a selecting element. FIG. 7 briefly illustrates the memory element of the memory cell.

The memory element 16 has a variable resistance value depending on an applied current I. Therefore, the memory element 16 may be referred to as a resistor element (i.e., R and V being voltage). Referring to FIG. 7 illustrating the cross-section of the memory element 16, the memory element 16 may include a top electrode 11, a GST material 12, a contact plug (CP) 13, and a bottom electrode 14.

The top electrode 11 may be connected to a bit line BL. The bottom electrode 14 may be connected between the CP 13 and a selecting element (not illustrated). The CP 13 may be formed of a conductive material (for example, TiN). The CP 13 may also be referred to as a heater plug. The GST material 12 may be formed between the top electrode 11 and the CP 13.

The phase of the GST material 12 may change depending on the magnitude of a supplied current and the time during which the current is supplied. As illustrated in FIG. 2, the phase of the GST material corresponding to a reset state or set state is decided by an amorphous volume 15. As the phase of the GST material changes from the amorphous state to the crystalline state, the amorphous volume 15 decreases. The amorphous state corresponds to the reset state, and the crystalline state corresponds to the set state. The GST material 12 has a resistance value which is varied according to the amorphous volume 15. That is, data to be written into the memory cell is decided by the amorphous volume 15 of the GST material 12, which is formed according to an applied current.

Figure 8:
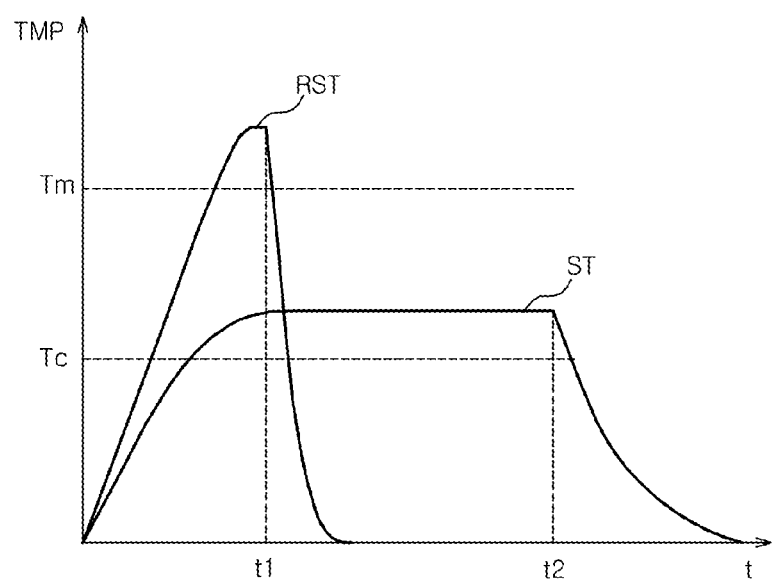
FIG. 8 is a graph for explaining the characteristics of a GST material illustrated in FIG. 7.

FIG. 8 is a graph for explaining the characteristics of the GST material illustrated in FIG. 7. With regards to FIG. 8 the x-axis represents time t and the y-axis represents temperature TMP. In FIG. 8, RST represents a condition at which the GST material changes into the amorphous state (that is, reset state), and ST represents a condition at which the GST material changes into the crystalline state (that is, set state).

The GST material changes to the amorphous state when the GST material is heated at a higher temperature than a melting temperature Tm during a time t1 and then rapidly quenched. For example, when the GST material changes to the amorphous state, the memory cell 10 of FIG. 1 may store data '0'. On the other hand, the GST material changes to the crystalline state when the GST material is heated at a higher temperature than a crystallization temperature Tc during a time t2 longer than the time t1 and then slowly quenched. The crystallization temperature Tc is lower than the melting temperature Tm. For example, when the GST material changes to the crystalline state, the memory cell 10 may store data '1'.

Figure 9:
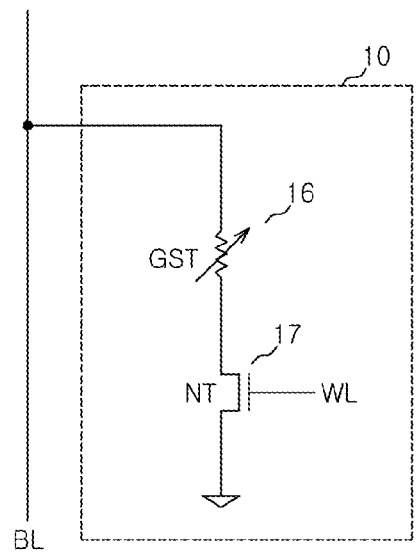
FIGS. 9 and 10 are circuit diagrams illustrating a memory cell of FIG. 1.
Figure 10:
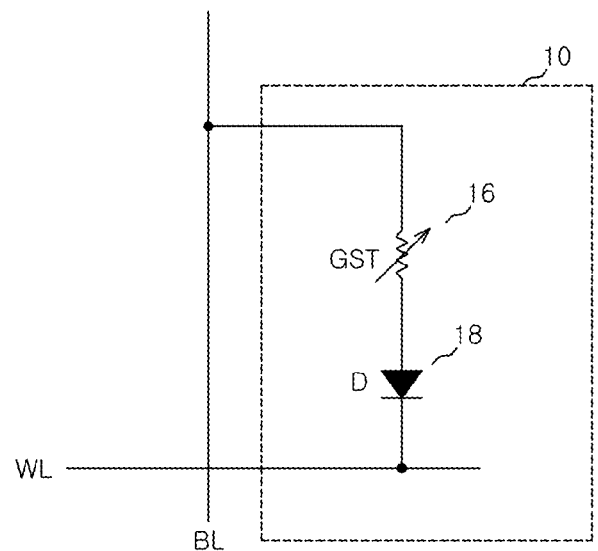

FIGS. 9 and 10 are circuit diagrams illustrating the memory cell of FIG. 1. FIG. 9 illustrates a phase change memory cell including a MOS switch-type selecting element, and FIG. 10 illustrates a phase change memory cell including a diode switch-type selecting element.

Referring to FIG. 9, the memory cell 10 may include a memory element 16 and a selecting element 17. The memory element 16 may be connected between a bit line BL and the selecting element 17. The selecting element 17 may be connected between the memory element 16 and the ground GND. The selecting element 17 has a gate connected to a word line WL. FIG. 9 illustrates that the memory element 16 may be connected between the bit line BL and the selecting element 17, but the selecting element 17 may be connected between the bit line BL and the memory element 16.

The memory element 16 has the same configuration and performs the same operation as the memory element illustrated in FIG. 7. Therefore, the detailed descriptions thereof will be omitted herein.

The selecting element 17 may include an NMOS transistor NT. When a predetermined voltage is applied to the word line WL to select the memory cell 10, the NMOS transistor NT is turned on. When the NMOS transistor NT is turned on, the memory element 16 receives a current through the bit line BL.

Referring to FIG. 10, the memory cell 10 may include a memory element 16 and a selecting element 18. The memory element 16 may be connected between the bit line BL and the selecting element 18. The selecting element 18 may be connected between the memory element 16 and the word line WL.

The memory element 16 has the same configuration and performs the same operation as the memory element illustrated in FIG. 7. Therefore, the detailed descriptions thereof will be omitted herein.

The selecting element 18 may include a diode D. The diode D has an anode connected to the memory element 16 and a cathode connected to the word line WL. When a ground voltage GND is applied to the word line WL to select the memory cell 10, a voltage difference between the anode and the cathode of the diode D is changed. When the voltage difference between the anode and the cathode of the diode D becomes higher than the threshold voltage of the diode D, the diode D is turned on. When the diode D is turned on, the memory element 16 receives a current through the bit line BL.

According to the embodiments, it is possible to measure a write current applied to a selected memory cell.

While various embodiments have been described above, it will be understood to those skilled in the art that the embodiments described are by way of example only. Accordingly, the semiconductor memory device described herein should not be limited based on the described embodiments.

What is claimed is:

1. A method for measuring a write current of a semiconductor memory device, comprising the steps of:
    selecting a memory cell whose write current is to be measured among memory cells,
    programming initial data into the memory cells which are to be programmed at substantially the same time;
    determining whether the memory cells are programmed into a same state or not;
    inputting test data when the memory cells are programmed into the same state, wherein a selected bit of the test data is configured to have an opposite logical level to a corresponding bit of the initial data and the selected bit is to be programmed into the selected memory cell;
    setting write current paths of the memory cells by comparing the initial data and the test data; and
    measuring the write current of the selected memory cell when the test data are programmed into the memory cells.

2. The method according to claim 1, wherein the step of setting the write current paths comprises the step of forming a write current path of the selected memory cell.

3. The method according to claim 1, wherein the initial data programmed into the respective memory cells are at a logic low level,
    the selected bit of the test data programmed into the selected memory cell is at a logic high level, and
    other bits of the test data programmed into other memory cells except the selected memory cell of the memory cells are at a logic low level.

4. The method according to claim 1, wherein the initial data programmed into the respective memory cells are at a logic high level,
    the selected bit of the test data programmed into the selected memory cell is at a logic low level, and
    other bits of the test data programmed into other memory cells except the selected memory cell of the memory cells are at a logic high level.

5. A semiconductor memory device comprising:
    a plurality of memory cells configured to be programmed at substantially the same time, wherein the memory cells comprise a selected memory cell whose write current is to be measured;
    a plurality of write drivers allocated to the respective memory cells and configured to provide a write current set according to the state of input data to the respective memory cells; and
    a plurality of write current path control units allocated to the respective memory cells and configured to compare initial data programmed into the respective memory cells to test data to be programmed into the respective memory cells and set a write current path between the memory cells and the corresponding write drivers according to the comparison result, during a test operation,
    wherein bits of the initial data are configured to have the same logical levels, wherein a selected bit of the test data is configured to have an opposite logical level to a corresponding bit of the initial data and the selected bit is to be programmed into the selected memory cell.

6. The semiconductor memory device according to claim 5, wherein when the initial data and the test data have opposite values, the write current path control units form write current paths between the corresponding memory cells and the corresponding write drivers.

7. The semiconductor memory device according to claim 6, wherein the write current path control units are formed inside the corresponding write drivers, respectively.

8. The semiconductor memory device according to claim 7, wherein the write drivers comprise current sources for applying a write current to the respective memory cells, and
    the write current path control units enable the current sources of the corresponding write drivers.

9. The semiconductor memory device according to claim 7, further comprising bit lines connected between the write drivers and the memory cells, respectively.

10. The semiconductor memory device according to claim 6, wherein the write current path control units are formed outside the corresponding write drivers.

11. The semiconductor memory device according to claim 10, further comprising switches connected between the memory cells and the write drivers, and
    the write current path control units form the write current paths according to control of the corresponding switches.

12. The semiconductor memory device according to claim 11, further comprising bit lines connected between the switches and the write drivers.

13. The semiconductor memory device according to claim 5, wherein each of the write current path control units comprises:
    an initial data storing block configured to store the initial data; and
    a compare block configured to compare the initial data stored in the initial data storing block to the test data, and output a control signal for setting the write current path according to the comparison result.

14. The semiconductor memory device according to claim 5, wherein the memory cells are connected to different input/output pins.

15. The semiconductor memory device according to claim 5, wherein the memory cells comprise a memory element and a selecting element, the memory element having a variable resistance value depending on an applied current to the memory element.

* * * * *